United States Patent [19]
Brennan

[11] Patent Number: 6,041,169
[45] Date of Patent: Mar. 21, 2000

[54] METHOD AND APPARATUS FOR PERFORMING INTEGRATED CIRCUIT TIMING INCLUDING NOISE

[75] Inventor: Thomas C. Brennan, Rochester, Minn.

[73] Assignee: International Business Machines Corporation, Armonk, N.Y.

[21] Appl. No.: 08/915,941

[22] Filed: Aug. 21, 1997

[51] Int. Cl.[7] .................................................. G06F 13/50
[52] U.S. Cl. .............................. 395/500.07; 395/500.23; 395/500.34; 395/500.35; 395/500.4
[58] Field of Search .................................... 364/578, 489, 364/481, 490, 488, 491; 395/500, 500.07, 500.23, 500.34, 500.35, 500.4; 371/27

[56] References Cited

U.S. PATENT DOCUMENTS

| | | | |
|---|---|---|---|
| 4,594,677 | 6/1986 | Barlow | 364/578 |
| 4,827,427 | 5/1989 | Hyduke . | |
| 4,924,430 | 5/1990 | Zasio et al. . | |
| 5,180,937 | 1/1993 | Laird et al. . | |
| 5,333,032 | 7/1994 | Matsumoto et al. . | |
| 5,402,357 | 3/1995 | Schaefer et al. . | |
| 5,404,311 | 4/1995 | Isoda . | |
| 5,424,985 | 6/1995 | McClure et al. . | |
| 5,426,591 | 6/1995 | Ginetti et al. . | |
| 5,461,575 | 10/1995 | Schucker et al. | 364/489 |
| 5,475,607 | 12/1995 | Apte et al. . | |
| 5,477,460 | 12/1995 | Vakirtzis et al. . | |
| 5,481,695 | 1/1996 | Purks | 395/500 |
| 5,521,837 | 5/1996 | Frankle et al. . | |
| 5,530,654 | 6/1996 | Takahashi . | |

FOREIGN PATENT DOCUMENTS

| | | |
|---|---|---|
| 2-68933 | 3/1990 | Japan . |
| 6177249 | 6/1994 | Japan . |
| 7169842 | 7/1995 | Japan . |
| 8167652 | 6/1996 | Japan . |

OTHER PUBLICATIONS

Deutsch et al, "Modeling and characterization of long on–chip interconnections for high–performance microprocessors" IBM J. Res. Develop. vol. 39, No. 5, Sep. 1995, pp. 547–567.

Primary Examiner—Kevin J. Teska
Assistant Examiner—Lonnie A. Knox
Attorney, Agent, or Firm—Birch, Stewart, Kolasch & Birch

[57] ABSTRACT

A method, apparatus, and article of manufacture for performing timing analysis on an integrated circuit, which run a high level chip timing tool with initial RC delays for all nets of the integrated circuit; determine a list of time-critical nets from a timing report and obtain a full RC coupling network for each time-critical net; run a detailed circuit simulator on the full RC coupling network for each time-critical net to obtain actual RC delays for each time-critical net; determine a delta time for each time-critical net, based on a difference between the initial RC delay and the corresponding actual RC delay for each time-critical net; and rerun the high level chip timing tool, including the delta time for each time-critical net to obtain a timing analysis of the integrated circuit which accounts for signal to signal noise.

12 Claims, 5 Drawing Sheets

6,041,169

METHOD AND APPARATUS FOR PERFORMING INTEGRATED CIRCUIT TIMING INCLUDING NOISE

BACKGROUND OF THE INVENTION

The present invention relates in general to a method and apparatus for performing integrated circuit timing which accounts for noise, due to signal coupling. More particularly, in the field of integrated circuit design, the present invention is directed to a method and apparatus which identifies critical nets which could be affected by signal to signal noise, extracts a full circuit topology, including neighboring signals, for those critical nets, determines actual delays, which includes noise from other signals and corrects inputs to a full chip timing run, which more accurately determines the actual operation of the integrated circuit.

DESCRIPTION OF RELATED ART

Prior art systems have recognized the importance of noise and the importance of diagnosing the noise from power supplies due to the simultaneous switching of circuits on multiple chip modules. In particular, U.S. Pat. No. 4,594,677 discloses a system for detecting and diagnosing problems due to excessive levels of current switching noise.

Space-efficient host packages have been developed for VLSI logic chips. The multichip module is such a package, commonplace in modem high-performance data processing equipment. Although multichip module packaging solves many design problems, it introduces or intensifies certain other design and manufacturing problems. Among the design problem categories affected is electrical noise. One type of noise which can present design problems is switching or "Delta I" noise. This noise is generated by high current switching in the undecoupled inductances of chip and module power and signal distribution networks. It is caused primarily by the switching of interchip and intermodule signal nets.

The factors which can make "Delta I" noise a design problem in the logic of modem high-performance computers is the parallelism of the data flow paths, the high speed drivers used and the great difficulty of providing adequate decoupling capacitors for the effective inductance of a dense multichip module. When one Delta I noise contributor switches, many of the logically related contributors are also likely to do so. If, for example, many drivers within a given chip or in neighboring chips can switch simultaneously, there is a data-dependent potential for generating Delta I noise. This noise may be sufficient either to delay the desired switchings or to impress excessive amounts of Delta I noise into quiescent drivers and their receivers. The latter condition can cause the reading and retention of spurious data.

In order to solve this problem, prior art systems, such as those disclosed in U.S. Pat. No. 4,594,677 detect and diagnose noise caused by current switching in a computerized simulation model for analyzing composite logic circuits. The prior art system in U.S. Pat. No. 4,594,677 includes a logic simulator for simulating logic experiments, a noise contributor information file generator for providing identification data corresponding to each current switching device that contributes noise and for performing post-analysis of the results of a simulation, a noise activity file generator for creating an activity file of events, derived from the simulation results, that represent the operation of current switching devices identified by the noise contributor information file generator and a noise calculator-analyzer for determining the amount of noise created by each noise contributing current switching device and for measuring the total instantaneous noise at each event in the activity file.

FIG. 1 illustrates a portion of a module 10 having a plurality of integrated circuit chips, shown generally as reference numeral 12. In at least some of the chips 12 are disposed logic devices such as drivers "D" 14 and receivers "R" 16. Also on the chips 12 are non-logic devices such as terminators "T" 18. The drivers 14 are connected to the receivers 16 by means of lines 20.

A target area for simulating is defined generally at reference 22, shown in phantom lines. In FIG. 1, nine chips 12 are defined as the target area 22. In particular, the primary chip of interest 24 is shown surrounded by eight secondary chips 12.

The chips 12 are interrelated with each other and may be interrelated with chips on another module, not shown. Thus, drivers 14 and terminators 18 may be not only off-chip, but also off-module.

FIG. 2 is a graphical representation of signals generated by one chip and received by another. The sending chip is referred to as reference numeral 30 and the receiving chip is referred to as reference numeral 32. Both chips 30 and 32 have active as well as quiet components thereon. The active drivers 34, switching substantially simultaneously on the sending chip 30, provide positive going signals, represented collectively by reference numeral 36. These signals 36 have a flat, horizontal portion due to the Delta I noise 38 generated by the simultaneous switching activity and the module-effective inductance $L_{EFF}$ 39 on the chip 30.

The active driver signals 36 are received, over transmission lines 37 by receivers 40 on the receiving chip 32, referred to as reference numeral 42. The transmission line terminators $R_T$ 43 are present to eliminate signal reflection problems. The terminators $R_T$ 43 also introduce Delta I noise. The sending chip 30 can also have a quiet driver 44, which is influenced by the switching of the active drivers 34. A Delta I noise impressed on the quiet driver 44 is shown at reference numeral 46. A single transmission line 47 connects the quiet driver 44 to the quiet receiver 48 on the receiving chip 32. A noise threshold or tolerance is shown in dash lines as reference numeral 50. If a noise spike 52 exceeds the noise tolerance 50, then the quiet receiver 48 can interpret this noise level as a legitimate signal. This would be an erroneous interpretation. As a secondary disadvantage to Delta I noise, it can be seen that the signal 36 from the active driver 34 can be delayed by the horizontal portion of the signal 36.

Although prior art devices detect and diagnose noise caused by the simultaneous switching of circuits on multiple chip modules, they do not determine the effect of signal to signal noise on full chip timing of integrated circuits, which is one objective of the method and apparatus of the present invention.

In integrated circuit design, there are two timing tools. A first timing tool operates on simplified models in order to perform timing on an entire integrated circuit. Simplified models are block delays for circuits and wire delays for the signals connecting the circuits. This first timing tool may be considered "high level".

A second timing tool is a circuit simulator, which operates at a much more detailed level with greater accuracy, than the simplified models. The level of the circuit simulator includes transistors, resistors, and capacitors. The signal to signal noise effect is not modelled in the simplified wire models of the full chip timing tool but is modeled at the circuit simulator level, as indicated in "Modeling and Characterization of Long On-Chip Interconnections for High-Performance Microprocessors", Deutsch et al., IBM Journal of Research and Development, September 1995. Deutsch et al. also states that different switching of neighboring signals in modem integrated circuits produces a range of delays instead of a single delay.

Therefore, there is presently a need for an apparatus and method which perform integrated circuit timing, including signal to signal noise effects.

SUMMARY OF THE INVENTION

The present invention is intended to solve the above identified problems with the conventional simplified wire models and circuit simulators by providing a method and apparatus which identify critical nets which could have noise effects, extract a full circuit topology including neighbor signals, for those critical nets, and perform analysis on a circuit simulator for those critical nets. The method and apparatus of the present invention then determines the actual delays which include noise from other signals and corrects inputs to a full chip timing run, based on the actual delays determined. The full chip timing is then rerun with improved input which can then be used to determine the actual operation of the integrated circuit more accurately.

It is an object of the present invention to include signal to signal noise delay in high level timing of entire integrated circuits.

It is another object of the present invention to identify time-critical nets and perform a detailed circuit simulator on these time-critical nets, in order to obtain delta times, which are then utilized to rerun a full circuit timing tool, to thereby improve the accuracy of the timing analysis performed on an integrated circuit.

The objects of the present invention are achieved by providing a method of performing timing analysis on an integrated circuit, comprising the steps of:

running a high level chip timing tool with initial RC delays for all nets of the integrated circuit;

determining a list of time-critical nets from a timing report and obtaining a full RC coupling network for each time-critical net;

running a detailed circuit simulator on the full RC coupling network for each time-critical net to obtain actual RC delays for each time-critical net;

determining a delta time for each time-critical net, based on a difference between the initial RC delay and the corresponding actual RC delay for each time-critical net; and rerunning the high level chip timing tool, including the delta time for each time-critical net to obtain a timing analysis of the integrated circuit which accounts for signal to signal noise.

The objects of the present invention are further achieved by an apparatus for performing timing analysis on an integrated circuit, comprising:

high level chip timing means for performing an initial timing analysis with initial RC delays for all nets of the integrated circuit;

timing report means for determining a list of time-critical nets and obtaining a full RC coupling network for each time-critical net;

circuit simulator means for running a circuit simulation on the full RC coupling network for each time-critical net to obtain actual RC delays for each time-critical net; and determining means for determining a delta time for each time-critical net, based on a difference between the initial RC delay and the corresponding actual RC delay for each time-critical net;

said high level chip timing means further utilizing the delta time for each time-critical net to obtain an actual timing analysis of the integrated circuit which accounts for signal to signal noise.

The objects of the present invention are further achieved by an article of manufacture comprising:

a computer usable medium having computer readable program code means embodied therein for performing timing analysis on an integrated circuit, the computer readable program code means in said article of manufacture comprising:

computer readable program code high level chip timing means for causing a computer to perform an initial timing analysis with initial RC delays for all nets of the integrated circuit;

computer readable program code timing report means for causing the computer to determine a list of time-critical nets and obtaining a full RC coupling network for each time-critical net;

computer readable program code circuit simulator means for causing the computer to run a circuit simulation on the full RC coupling network for each time-critical net to obtain actual RC delays for each time-critical net; and computer readable program code determining means for causing the computer to determine a delta time for each time-critical net, based on a difference between the initial RC delay and the corresponding actual RC delay for each time-critical net;

said computer readable program code high level chip timing means further causing the computer to utilize the delta time for each time-critical net to obtain an actual timing analysis of the integrated circuit which accounts for signal to signal noise.

The objects of the present invention are further achieved by an apparatus for performing timing analysis on an integrated circuit, comprising:

a high level chip timing tool, performing an initial timing analysis with initial RC delays for all nets of the integrated circuit;

a timing report tool, determining a list of time-critical nets and obtaining a full RC coupling network for each time-critical net;

a circuit simulator, running a circuit simulation on the full RC coupling network for each time-critical net to obtain actual RC delays for each time-critical net; and a delta time determiner, determining a delta time for each time-critical net, based on a difference between the initial RC delay and the corresponding actual RC delay for each time-critical net;

said high level chip timing tool further utilizing the delta time for each time-critical net to obtain an actual timing analysis of the integrated circuit which accounts for signal to signal noise.

These and other objects of the present invention will become readily apparently from the detailed description given hereafter. However, it should be understood that a detailed description and specific examples, while indicating preferred embodiments of the invention are given by way of illustration only, since various changes and modifications within the spirit and scope of the invention become apparent to those skilled in the art from the detailed description set forth below.

BRIEF DESCRIPTION OF THE DRAWINGS

The present invention will become more fully understood from the detailed description given hereinbelow, and the accompanying drawings which are given by way of illustration only and thus are not limited of the present invention, wherein.

Further scope of applicability of the present invention will become apparent from the detailed description hereinafter. However, it should be understood that the detailed description is specific examples, while indicating preferred embodiments of the invention are given by way of illustration only, since various changes and modifications within the spirit and scope of the invention will become apparent to those skilled in the art from this detailed description.

DETAILED DESCRIPTION OF THE PREFERRED EMBODIMENT

The basic idea of the present invention is to incorporate signal to signal noise information into the basic timing of integrated circuits. This is achieved by determining a list of time critical nets from a timing report, which ignores noise, which could be influenced by noise and extract from the environment of these critical nets, a full RC coupling network. The present invention then runs a circuit simulator on these critical nets, including the neighboring nets and determines the actual delays to the pins of the critical nets. Then the present invention inserts a delta between the actual delays and the original RC delay into the pin adjustment entries of a chip timing tool, such as IBM Einstimer™ and re-runs the chip timing with the delta times added, thereby accounting for signal to signal noise in the chip timing tool.

Figure 1:
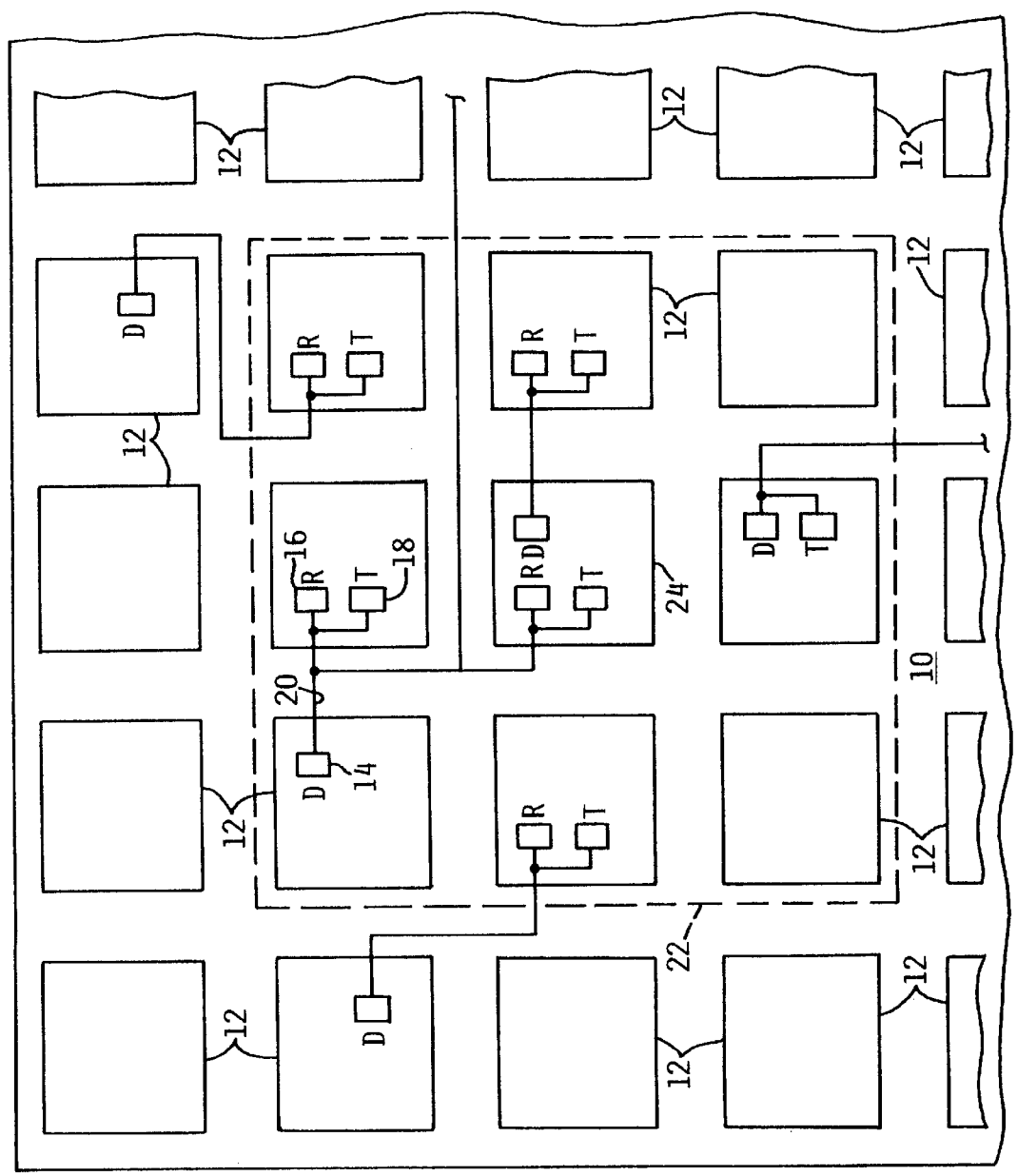
FIG. 1 is a prior art schematic block diagram showing interconnection of typical chips, off-chip drivers, and terminator blocks on a multichip module.
Figure 2:
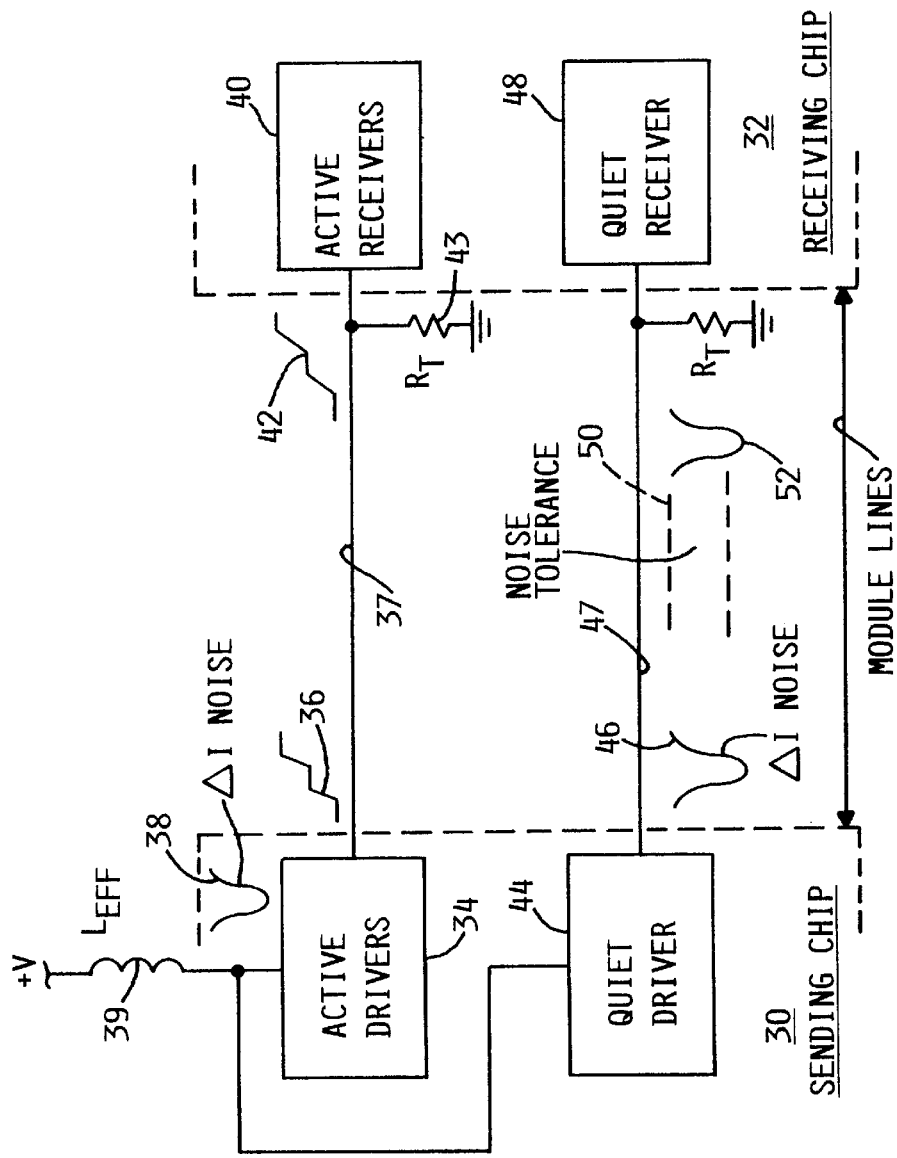
FIG. 2 is a prior art graphic representation of the effect of switching noise.
Figure 3:
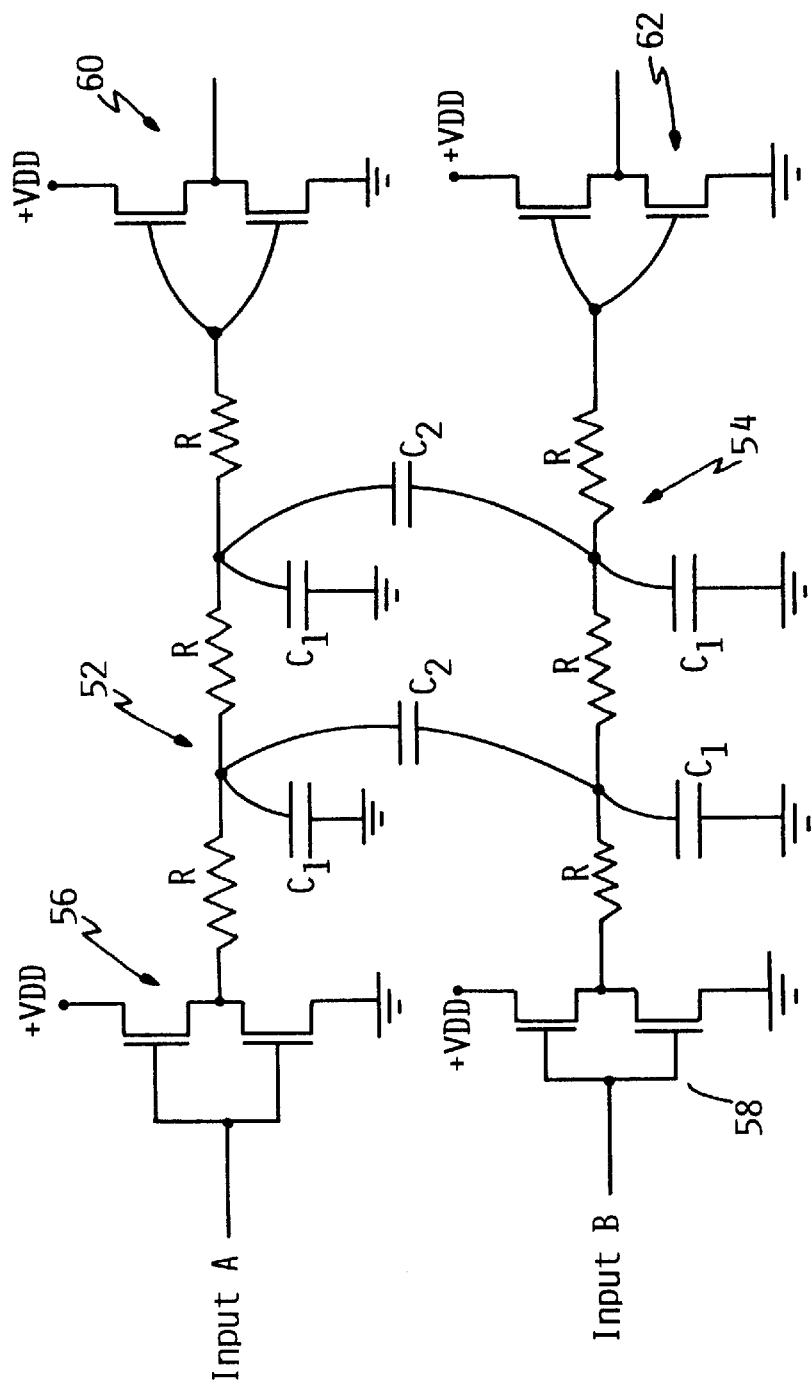
FIG. 3 illustrates a model of the connections which cause the signal to signal noise which is compensated for in the present invention.

As illustrated in FIG. 3, the metal wires 52 and 54 which connect elements 56 and 58 to elements 60 and 62, respectively are modelled by a resistance R and a capacitance to ground $C_1$. The wire to wire capacitances $C_2$, represent the signal to signal interference, which is of interest in the present invention.

Figure 4:
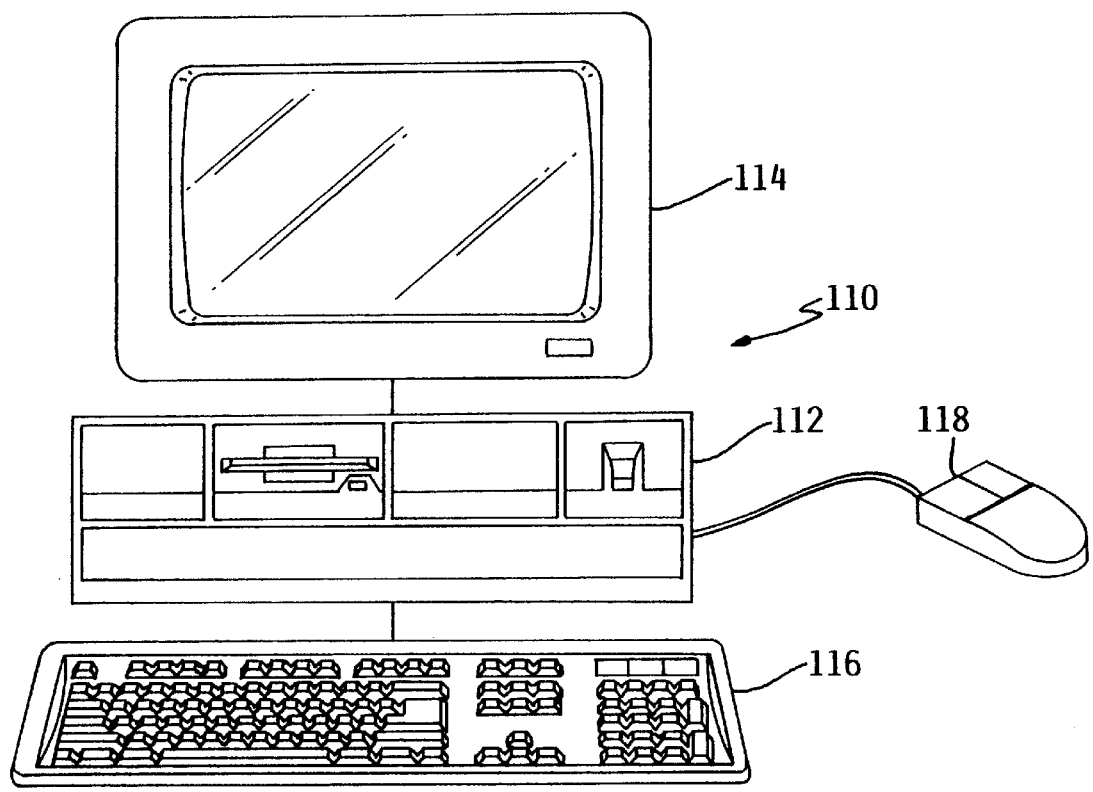
FIG. 4 illustrates the apparatus of the present invention, in one preferred embodiment.

The method and apparatus of the present invention aid in the design of integrated circuits. In practical terms, the design of very large scale integrated circuits is performed on a computer utilizing computer software. The physical apparatus required for the present invention is illustrated in FIG. 3, which is a data processing system. Examples include but are not limited to personal computers and workstations such as the IBM RISC System/6000™. A personal computer 10 is illustrated in FIG. 4 and includes a number of interconnecting components. A system unit 112 is coupled to a keyboard 116, a mouse 118 and a computer 114. Those skilled in the art are aware of the conventional components of the system unit. These conventional components include hard disk drives, one or more central processing units, high speed cache and standard memory, modems, and/or local area networks, interfaces, etc. In addition the system unit 112 contains an operating system, such as UNIX™ or IBM OS/2™.

Figure 5:
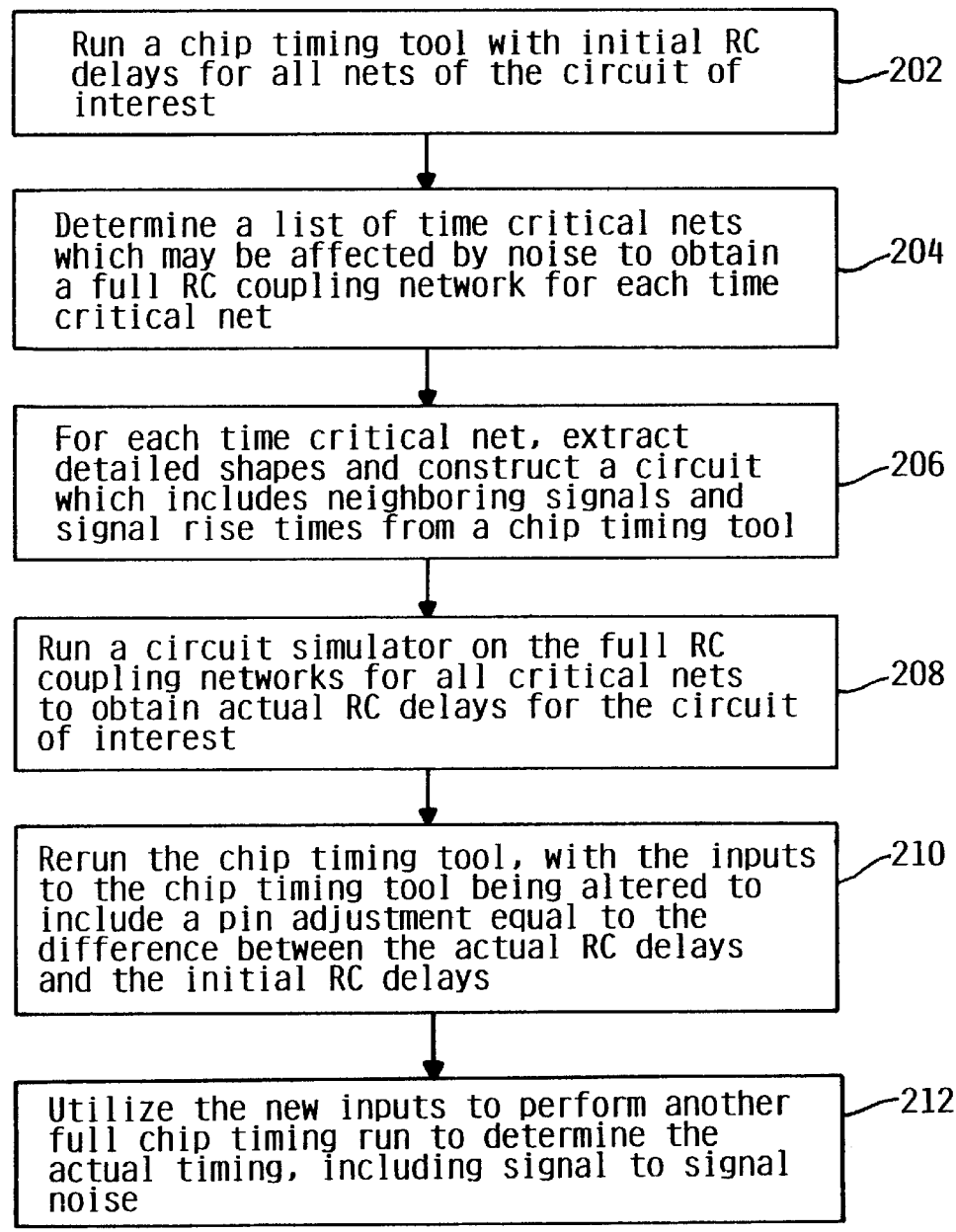
FIG. 5 is a flowchart of the method of the present application in one embodiment.

FIG. 5 illustrates the method of the present application, in one embodiment. The first step of the present method, step 202, includes running a chip timing tool with initial RC delays for all nets of the circuit of interest. The second step of the present method, step 204, determines a list of time critical nets which may be affected by noise, from a timing report, to obtain a full RC coupling network for each of the time critical nets. In step 206, for each time critical net, detailed shapes are extracted and a circuit constructed, which includes neighboring signals and signal rise times from a chip timing tool. In step 208, a circuit simulator is run on the full RC coupling networks for all critical nets in order to obtain actual RC delays for the circuit of interest. In step 210, the chip timing tool is rerun, with the inputs to the chip timing tool being altered by including a pin adjustment equal to the difference between the actual RC delays and the initial RC delays. In step 212, the new, more accurate input is utilized to perform another full chip timing run to determine the actual timing, including signal to signal noise.

With integrated circuits increasing in frequency and with ever smaller wiring, noise is becoming more and more of a factor. However, full chip timing tools have no concept of noise and assume ideal rise and fall times of signals. The present application proposes to perform a noise analysis of the wire integrated circuit and feed an input into a chip timing tool. If noise on the signal is found to be tolerable, which means circuit operation can still continue, but there is an increase in delay, this delay can be added into the path to obtain a more accurate indication of actual chip timing. Further, if noise on the signal is found to be intolerable and would adversely affect circuit operation, an infinite delay can be added to the path, indicating a circuit failure by a huge timing miss. The present invention is applicable to both static and dynamic circuits.

The invention being thus described, it will be obvious that the same may be various in many ways. Such variations are not to be regarded as a departure from the spirit and scope of the invention, and all such modifications as would be obvious to one skilled in the art are intended to be included within the scope of the following claims.

What is claimed is:

1. A method of performing timing analysis on an integrated circuit, comprising the steps of:

running a high level chip timing tool with initial RC delays for all nets of the integrated circuit;

determining a list of time-critical nets from a timing report and obtaining a full RC coupling network for each time-critical net;

running a detailed circuit simulator on the full RC coupling network for each time-critical net to obtain actual RC delays for each time-critical net;

determining a delta time for each time-critical net, based on a difference between the initial RC delay and the corresponding actual RC delay for each time-critical net; and rerunning the high level chip timing tool, including the delta time for each time-critical net to obtain a timing analysis of the integrated circuit which accounts for signal to signal noise.

2. The method of claim 1, wherein the integrated circuit is a dynamic circuit.

3. The method of claim 1, wherein the integrated circuit is a static circuit.

4. An apparatus for performing timing analysis on an integrated circuit, comprising:

high level chip timing means for performing an initial timing analysis with initial RC delays for all nets of the integrated circuit;

timing report means for determining a list of time-critical nets and obtaining a full RC coupling network for each time-critical net;

circuit simulator means for running a circuit simulation on the full RC coupling network for each time-critical net to obtain actual RC delays for each time-critical net; and determining means for determining a delta time for each time-critical net, based on a difference between the initial RC delay and the corresponding actual RC delay for each time-critical net;

said high level chip timing means further utilizing the delta time for each time-critical net to obtain an actual timing analysis of the integrated circuit which accounts for signal to signal noise.

5. The apparatus of claim 4, wherein the integrated circuit is a dynamic circuit.

6. The apparatus of claim 4, wherein the integrated circuit is a static circuit.

7. An article of manufacture comprising:

a computer usable medium having computer readable program code means embodied therein for performing timing analysis on an integrated circuit, the computer readable program code means in said article of manufacture comprising:

computer readable program code high level chip timing means for causing a computer to perform an initial timing analysis with initial RC delays for all nets of the integrated circuit;

computer readable program code timing report means for causing the computer to determine a list of time-critical nets and obtaining a full RC coupling network for each time-critical net;

computer readable program code circuit simulator means for causing the computer to run a circuit simulation on the full RC coupling network for each time-critical net to obtain actual RC delays for each time-critical net; and computer readable program code determining means for causing the computer to determine a delta time for each time-critical net, based on a difference between the initial RC delay and the corresponding actual RC delay for each time-critical net;

said computer readable program code high level chip timing means further causing the computer to utilize the delta time for each time-critical net to obtain an actual timing analysis of the integrated circuit which accounts for signal to signal noise.

8. The article of manufacture of claim 7, wherein the integrated circuit is a dynamic circuit.

9. The article of manufacture of claim 7, wherein the integrated circuit is a static circuit.

10. An apparatus for performing timing analysis on an integrated circuit, comprising:

a high level chip timing tool, performing an initial timing analysis with initial RC delays for all nets of the integrated circuit;

a timing report tool, determining a list of time-critical nets and obtaining a full RC coupling network for each time-critical net;

a circuit simulator, running a circuit simulation on the full RC coupling network for each time-critical net to obtain actual RC delays for each time-critical net; and a delta time determiner, determining a delta time for each time-critical net, based on a difference between the initial RC delay and the corresponding actual RC delay for each time-critical net;

said high level chip timing tool further utilizing the delta time for each time-critical net to obtain an actual timing analysis of the integrated circuit which accounts for signal to signal noise.

11. The apparatus of claim 10, wherein the integrated circuit is a dynamic circuit.

12. The apparatus of claim 10, wherein the integrated circuit is a static circuit.

* * * * *